(12) United States Patent
Kim et al.

(10) Patent No.: US 12,142,654 B2
(45) Date of Patent: Nov. 12, 2024

(54) THREE-DIMENSIONAL SEMICONDUCTOR DEVICE INCLUDING A WORD LINE STRUCTURE HAVING A PROTRUDING PORTION

(71) Applicant: SK hynix Inc., Gyeonggi-do (KR)

(72) Inventors: Nam Kyeong Kim, Gyeonggi-do (KR); Yeong Jo Mun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 614 days.

(21) Appl. No.: 17/339,051

(22) Filed: Jun. 4, 2021

(65) Prior Publication Data
US 2022/0231140 A1 Jul. 21, 2022

(30) Foreign Application Priority Data
Jan. 15, 2021 (KR) .................. 10-2021-0006066

(51) Int. Cl.
*H01L 29/423* (2006.01)
*H01L 21/28* (2006.01)
(Continued)

(52) U.S. Cl.
CPC .... *H01L 29/4234* (2013.01); *H01L 29/40117* (2019.08); *H10B 43/27* (2023.02); *H10B 43/40* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40;
(Continued)

(56) References Cited

U.S. PATENT DOCUMENTS

| | | | |
|---|---|---|---|
| 2012/0276702 A1* | 11/2012 | Yang ................. | H01L 29/66765 438/491 |
| 2016/0172370 A1* | 6/2016 | Makala ................. | H10B 43/27 438/269 |

(Continued)

FOREIGN PATENT DOCUMENTS

| KR | 10-2009-0006134 | 1/2009 |
|---|---|---|
| KR | 10-2015-0021106 | 2/2015 |
| KR | 10-2020-0012038 | 2/2020 |

*Primary Examiner* — Didarul A Mazumder
*Assistant Examiner* — Gustavo G Ramallo
(74) *Attorney, Agent, or Firm* — IP & T GROUP LLP

(57) ABSTRACT

A three-dimensional semiconductor device is provided. The three-dimensional device may include substrate; a common electrode layer on the substrate; a word line stack disposed on the common electrode layer, the word line stack having interlayer insulating layers and word lines structures alternately stacked and; and a vertical channel pillar penetrating the word line stack, the vertical channel pillar being electrically connected to the common electrode layer. Each of the word line structures includes a body portion having a first vertical width and an extension portion having a second vertical width greater than the first vertical width. The extension portion abuts the vertical channel pillar.

20 Claims, 21 Drawing Sheets

(51) Int. Cl.
 *H10B 43/27* (2023.01)
 *H10B 43/40* (2023.01)
(58) Field of Classification Search
 CPC ........ H10B 43/50; H10B 51/00; H10B 51/10;
 H10B 51/20; H10B 51/30; H10B 51/40;
 H10B 51/50
 See application file for complete search history.

(56) References Cited

U.S. PATENT DOCUMENTS

| | | | |
|---|---|---|---|
| 2018/0040627 A1* | 2/2018 | Kanakamedala | H10B 41/27 |
| 2019/0214402 A1* | 7/2019 | Lin | G11C 16/3422 |
| 2020/0127126 A1* | 4/2020 | Lee | H01L 29/66833 |
| 2020/0194458 A1* | 6/2020 | Kim | H01L 29/42368 |

* cited by examiner

THREE-DIMENSIONAL SEMICONDUCTOR DEVICE INCLUDING A WORD LINE STRUCTURE HAVING A PROTRUDING PORTION

CROSS-REFERENCE TO RELATED APPLICATION

This application claims priority under 35 U.S.C. § 119(a) to Korean Patent Application No. 10-2021-0006066 filed on Jan. 15, 2021, which is incorporated herein by reference in its entirety.

BACKGROUND

1. Technical Field

This disclosure relates to a three-dimensional (3D) semiconductor device including a word line structure having a protruding portion and a method of manufacturing the 3D semiconductor device.

2. Related Art

A 3D semiconductor device with high degree of integration has been proposed. The 3D semiconductor device can store data by trapping charges according to an electric field between a word line structure and a channel layer.

SUMMARY

An embodiment of the disclosure provides a word line structure configured to widen an electric field and a 3D semiconductor device having the word line structure.

An embodiment of the disclosure provides a word line structure having an improved charge trapping ability and a 3D semiconductor device having the word line structure.

A three-dimensional memory device according to an embodiment of the disclosure may include substrate; a common electrode layer on the substrate; a word line stack disposed on the common electrode layer, the word line stack having interlayer insulating layers and word lines structures alternately stacked; and a vertical channel pillar penetrating the word line stack, the vertical channel pillar being electrically connected to the common electrode layer. Each of the word line structures includes a body portion having a first vertical width and an extension portion having a second vertical width greater than the first vertical width. The extension portion abuts the vertical channel pillar.

A three-dimensional memory device according to an embodiment of the disclosure may include a substrate; a common electrode layer on the substrate; a word line stack disposed on the common electrode layer, the word line stack including interlayer insulating layers and word lines structures alternately stacked; and a vertical channel pillar penetrating the word line stack and electrically connected to the common electrode layer. Each of the word line structure includes a body portion between the interlayer insulating layers and an extension portion in contact with the vertical channel pillar. The extension portion includes an upper protruding portion upwardly protruding from a top surface of the body portion and a lower protruding portion downwardly protruding from a bottom surface of the body portion.

A semiconductor device according to an embodiment of the disclosure may include a word line stack disposed over a common electrode layer, the word line stack including interlayer insulating layers and word line structures alternating stacked. Each of the word line structures may include a body portion and an extension portion at one end of the body portion. The extension portion may be in contact with a vertical channel pillar. The extension portion may include an upper protrusion extending vertically upwardly above a top surface of the body portion and a lower protruding portion extending vertically downwardly below a bottom surface of the body portion.

DETAILED DESCRIPTION

Figure 1:
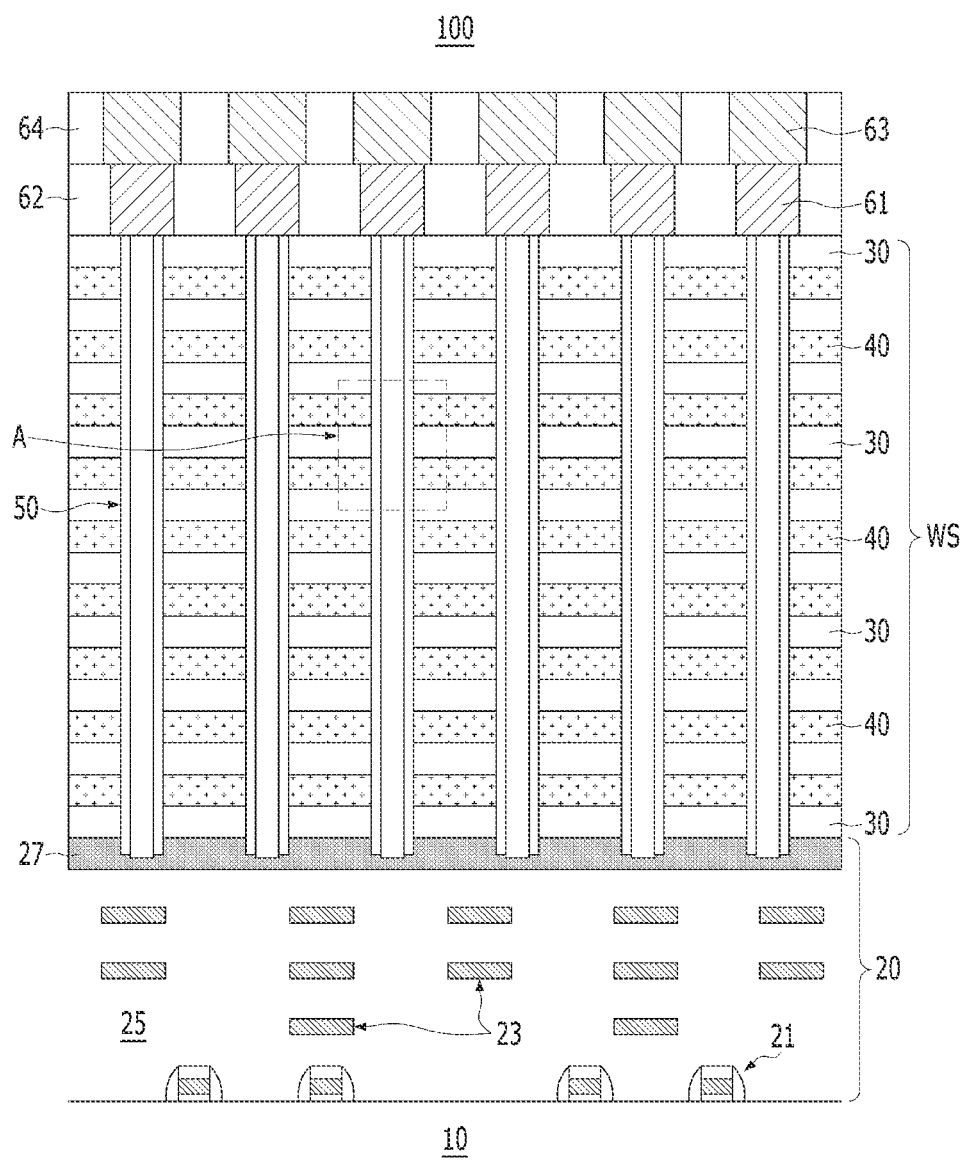
FIG. 1 is a schematic longitudinal cross-sectional view of a 3D semiconductor device according to an embodiment of the disclosure.

Various examples and embodiments of the disclosed technology are described below in detail with reference to the accompanying drawings. The drawings may not be necessarily to scale, and in some instances, proportions of at least some structures in the drawings may be exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example and different relative positioning relationships or sequences of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, however, a multi-layer structure where one or more other intermediate layers exist between the first layer and the second layer or the substrate may be included in other embodiments or examples.

FIG. 1 is a schematic longitudinal cross-sectional view of a 3D semiconductor device 100 according to an embodiment of the disclosure. Referring to FIG. 1, a 3D semiconductor device 100 according to an embodiment of the disclosure may include a logic circuit layer 20 formed on a substrate 10, and a word line stack WS, vertical channel pillars 50, contact plugs 61, a lower interconnection insulating layer 62, bit lines 63, and an upper interconnection insulating layer 64 formed on the logic circuit layer 20.

The substrate 10 may include a semiconducting material. For example, the substrate 10 may include one of a single crystalline silicon wafer, an epitaxial grown silicon layer, a silicon-on-insulator (SOI), a compound semiconductor, and other semiconductor layer.

The logic circuit layer 20 may include a transistor 21, a logic interconnection 23, a logic insulating layer 25, and a common electrode layer 27. The transistor 21 may include a gate electrode disposed on the substrate 10 and a source/drain electrode formed in the substrate 10. The logic interconnection 23 may include multi-layered metal layers. The logic insulating layer 25 may surround the transistor 21 and the logic interconnection 23 to insulate each other. The common electrode layer 27 may be disposed on an uppermost portion of the logic circuit layer 20. The common electrode layer 27 may include polysilicon layer doped with N-type ions, a metal layer such as, for example, tungsten (W), a metal compound layer such as, for example, titanium nitride (TiN), or a metal silicide layer. The common electrode layer 27 may have a plate shape.

The word line stack WS may include interlayer insulating layers 30 and word line structures 40 that are alternately stacked. The interlayer insulating layers 30 may insulate the common electrode layer 27 and the word line structures WS in a vertical direction. The interlayer insulating layers 30 may include silicon oxide ($SiO_2$). Each of the word line structures 40 may include a conductive material.

The vertical channel pillars 50 may vertically penetrate the word line stack WS to be electrically connected to the common electrode layer 27. The vertical channel pillars 50 may downwardly protrude into the common electrode layer 27.

The lower interconnection insulating layer 62 may be formed on the word line stack WS and the vertical channel pillars 50.

The contact plugs 61 may pass through the lower interconnection insulating layer 62 to be electrically connected to the vertical channel pillars 50. The contact plugs 61 may have a pillar shape.

The upper interconnection insulating layer 64 may be formed on the lower interconnection insulating layer 62 and the contact plugs 61.

The bit lines 63 may be connected to the contact plugs 61 and may have a shape of parallel lines.

The lower interconnection insulating layer 62 and the upper interconnection insulating layer 64 may include silicon oxide ($SiO_2$). The contact plugs 61 and the bit lines 63 may include a metal such as, for example, tungsten (W) or a metal nitride such as, for example, titanium nitride (TiN).

Figure 2A:
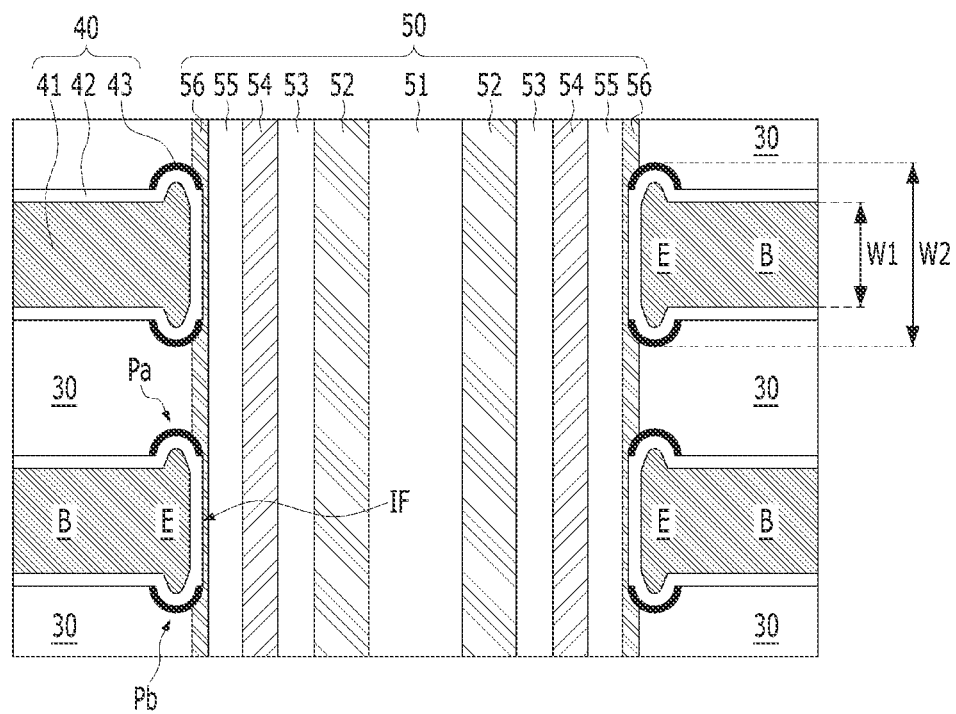
FIG. 2A is an enlarged view of area A of FIG. 1.

FIG. 2A is an enlarged view of area A of FIG. 1. Referring to FIG. 2A, the vertical channel pillar 50 may include an insulating core pillar 51, a channel layer 52, a tunneling layer 53, a charge trap layer 54, a barrier insulating layer 55, and a buffer layer 56.

The core pillar 51 may be disposed in a center. The core pillar 51 may include an insulating material such as, for example, silicon oxide ($SiO_2$).

The channel layer 52 may have a cylindrical shape surrounding a side surface of the core pillar 51. The channel layer 52 may include a semiconductor material such as, for example, silicon.

The tunneling layer 53 may have a cylindrical shape surrounding a side surface of the channel layer 52. The tunneling layer 53 may include an insulating material such as, for example, silicon oxide ($SiO_2$).

The charge trap layer 54 may have a cylindrical shape surrounding a side surface of the tunneling layer 53. The charge trap layer 54 may include a high-k material such as, for example, silicon nitride (SiN).

The barrier insulating layer 55 may have a cylindrical shape surrounding a side surface of the charge trap layer 54. The barrier insulating layer 55 may provide a potential barrier. The barrier insulating layer 55 may have a higher work function than the charge trap layer 54. The barrier insulating layer 55 may include a metal insulating material such as, for example, aluminum oxide ($Al_2O_3$).

The buffer layer 56 may have a cylindrical shape surrounding a side surface of the barrier insulating layer 55. The buffer layer 56 may include an insulating material softer than the barrier insulating layer 55 such as, for example, silicon oxide ($SiO_2$).

In an embodiment, the barrier insulating layer 55 may include silicon oxide ($SiO_2$), and the buffer layer 56 may include a metal insulating material such as, for example, aluminum oxide ($Al_2O_3$).

Each of the word line structures 40 may include a body portion B and an extension portion E. The body portion B may have a flat top surface and a flat bottom surface. For example, the body portion B may have a uniform vertical thickness. The extension portion E may have a greater vertical thickness than the body portion B.

The extension portion E may have an upper protrusion Pa that upwardly protrudes higher than the top surface of the body portion B. The extension portion E may have a lower protruding portion Pb that downwardly protrudes lower than the lower surface of the body portion B. The extension portion E may be positioned to abut the vertical channel pillar 50. For example, the extension portion E may laterally protrude inside the vertical channel pillar 50. In an embodiment, the upper and lower protrusions Pa and Pb may have the same shape and may be symmetrical to each other. For example, the upper and lower protrusions Pa and Pb may have a curved shape. The portion of the extension portion abutting with the vertical channel pillar 50 may be substantially flat with upper and lower edges gradually curving to the upper and lower protrusion Pa and Pb.

The body portion B may have a first vertical width W1, and the extension portion E may have a second vertical width W2. The second vertical width W2 may be greater than the first vertical width W1. In one embodiment, the extension portion E may replace a part of the interlayer insulating layer 30 and a part of the buffer layer 56. For example, a vertical interface IF between the word line structure 40 and the vertical channel pillar 50 may be located closer to the core pillar 51 of the vertical channel pillar 50 than a vertical interface between the interlayer insulating layer 30 and the vertical channel pillar 50. The vertical interface IF between the word line structure 40 and the vertical channel pillar 50 may be located inside the buffer layer 56.

The word line structure 40 may include a word line electrode 41, a barrier metal layer 42, and an insulating lining layer 43. The word line electrode 41 may form an electric field with the channel layer 52 of the vertical channel pillars 50. The word line electrode 41 may include a metal such as, for example, tungsten (W). The barrier metal layer 42 may surround a surface of the word line electrode 41. The barrier metal layer 42 may prevent the word line electrode 41 from contacting the interlayer insulating layer 30, the barrier insulating layer 55, the buffer layer 56, or the lining layer 43. The barrier metal layer 42 surrounding a surface of the word line electrode 41 in the body portion B of the word line structure 40 may contact the interlayer insulating layer 30.

The lining layer 43 may be conformally formed in the extension portion E. For example, the lining layer 43 may surround a surface of the barrier metal layer 42 at the protruding portion of the extension portion E. The lining layer 43 may include a high-k dielectric having a dielectric constant greater than 10, such as, for example, strontium titanate ($SrTiO_3$), zirconium oxide ($ZrO_2$), or hafnium oxide ($HfO_2$). The high-k dielectric refers to a material having a significantly higher dielectric constant than silicon nitride (SiN) or silicon oxide ($SiO_2$).

The barrier metal layer 42 and the vertical channel pillar 50 may directly contact each other at the vertical interface IF of the extension portion E of the word line structure 40. For example, the lining layer 43 may not be formed at the vertical interface IF of the extension portion E of the word line structure 40.

Figure 2B:
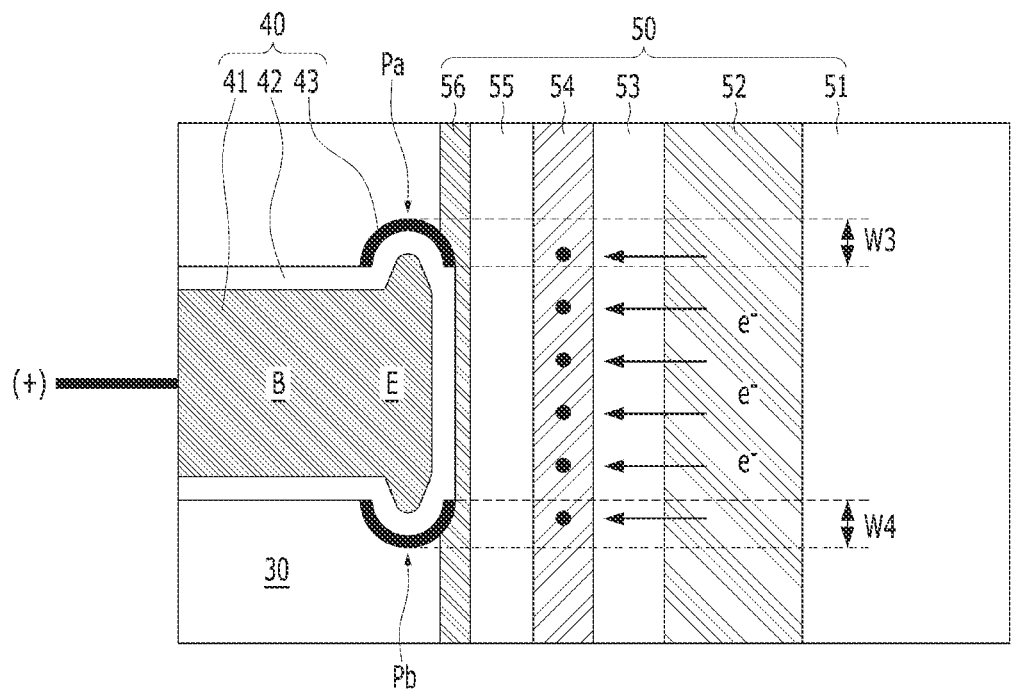
FIG. 2B is a diagram for explaining an operation of the word line structure of the embodiment of the disclosure.

FIG. 2B is a diagram for explaining an operation of the word line structure 40 of the embodiment of the disclosure. Referring to FIG. 2B, when a positive (+) voltage is applied to the word line structure 40, charges e− may be trapped from the channel layer 52 into the charge trap layer 54. In the 3D semiconductor device 100 according to the embodiment, charges e− may be further trapped into the charge trap layer 54 by the extension portion E of the word line structure 40. For example, an electric field between the word line structure 40 and the channel layer 52 can be widely formed by sum of a third vertical width W3 and a fourth vertical width W4 same as the difference between the second vertical width W2 of the extension part E and the first vertical width W1 of the body part B. Accordingly, amount of charges e− trapped in the charge trap layer 54 can be increased, and data of the 3D semiconductor device 100 can be more reliably erased and stored. The lining layer 43 formed on the protruding portion of the extension portion E may mitigate concentration of the electric field on edges of the word line structure 40.

Figure 3A:
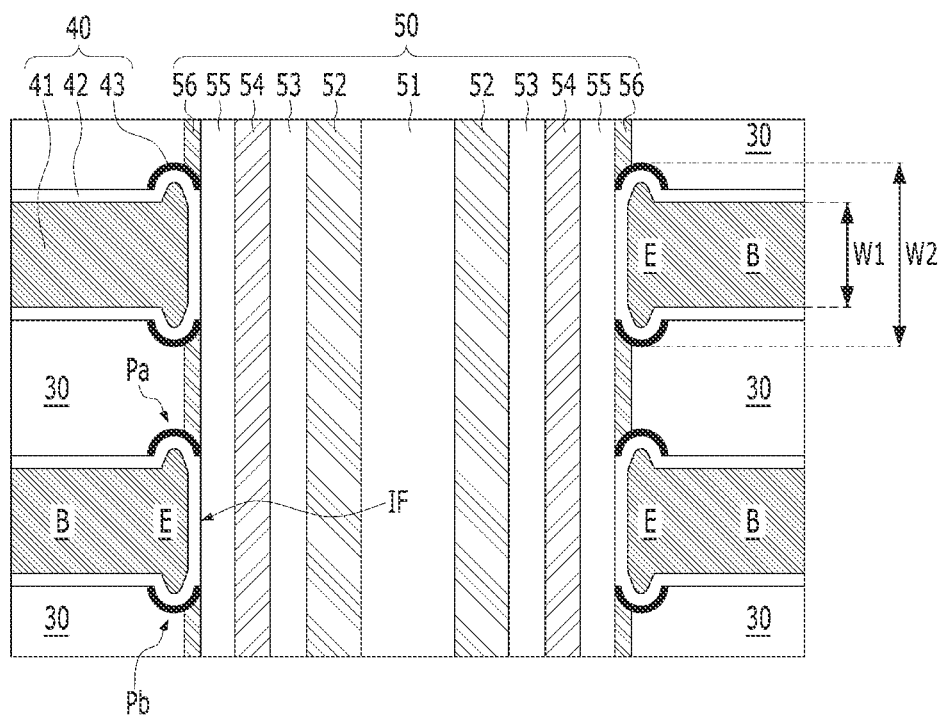
FIGS. 3A to 3D are diagrams schematically illustrating word line structures 40 according to embodiments of the disclosure.

FIGS. 3A to 3D are diagrams schematically illustrating word line structures 40 according to embodiments of the disclosure. Referring to FIG. 3A, the extension portion E of the word line structure 40 may replace a part of the interlayer insulating layer 30 and a part of the buffer layer 56. The vertical interface IF between the word line structure 40 and the vertical channel pillar 50 may abut the barrier insulating layer 55.

Figure 3B:
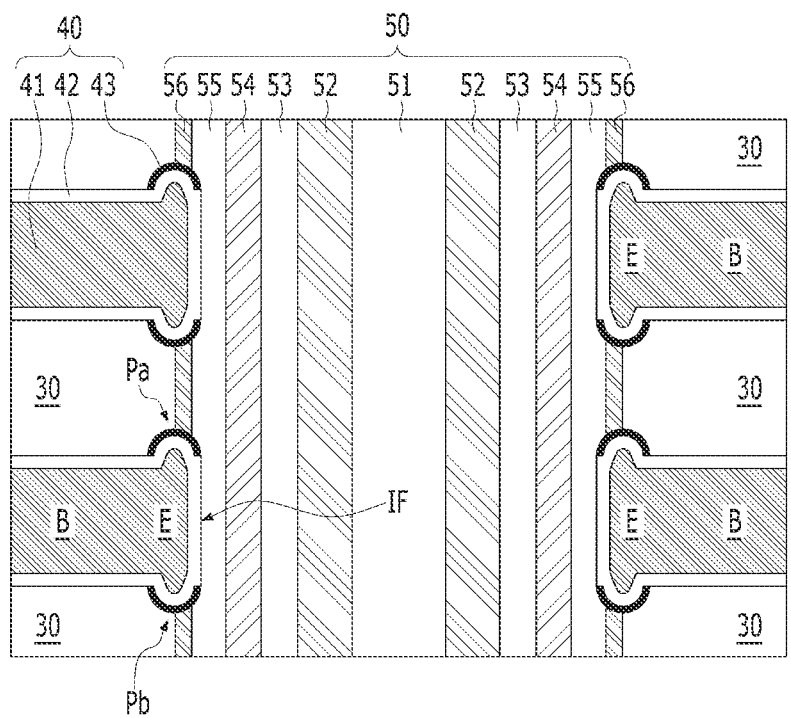

Referring to FIG. 3B, the extension portion E of the word line structure 40 may replace a part of the interlayer insulating layer 30, a part of the buffer layer 56, and a part of the barrier insulating layer 55. The vertical interface IF between the word line structure 40 and the vertical channel pillar 50 may be located inside the barrier insulating layer 55.

Figure 3C:
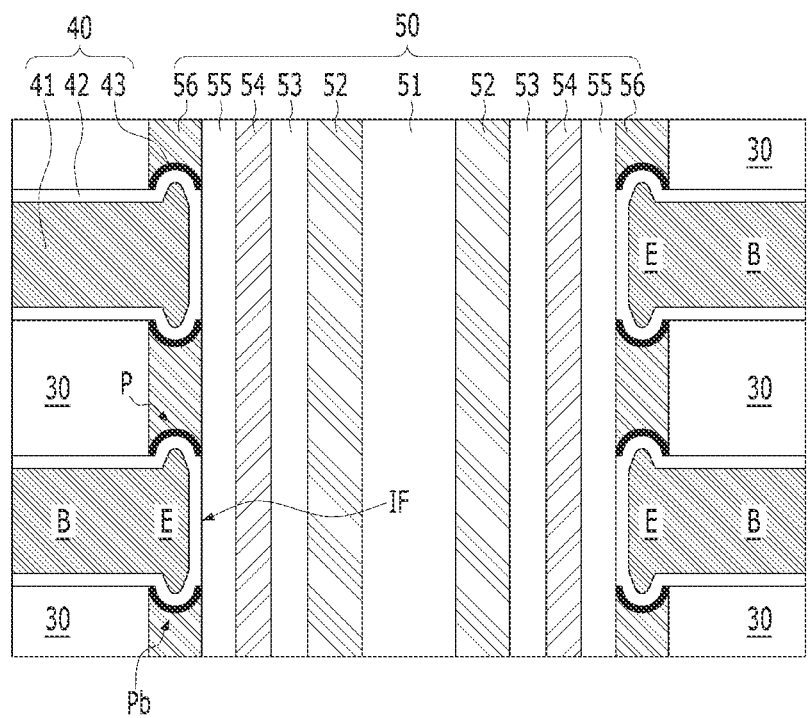

Referring to FIG. 3C, the extension portion E of the word line structure 40 may replace a part of the buffer layer 56. The vertical interface IF between the word line structure 40 and the vertical channel pillar 50 may abut the barrier insulating layer 55. The thickness of the buffer layer 56 and the thickness of the extension E may be similar or substantially the same. For example, the extension E may be confined to the inside of the vertical channel pillar 50. In one embodiment, the extension part E may partially protrude into the barrier insulating layer 55. In one embodiment, the extension portion E may protrude into the interlayer insulating layer 30.

Figure 3D:
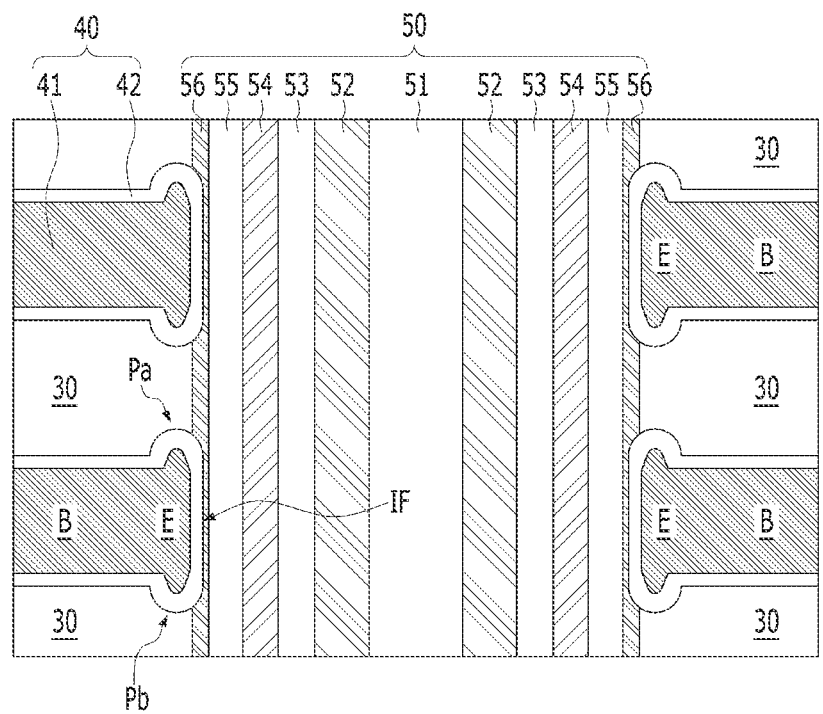

Referring to FIG. 3D, the word line structure 40 may include a word line electrode 41 and a barrier metal layer 42. In comparison with FIG. 2A, the lining layer 43 may be omitted. Features shown in FIGS. 2A and 3A to 3D may be compatible and combined with each other.

Figure 4A:
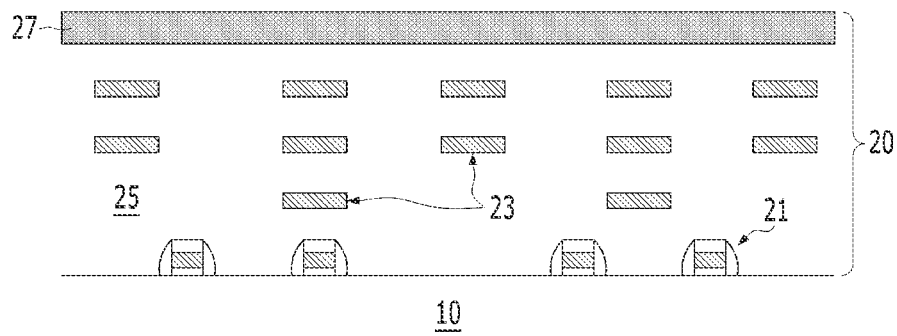
FIGS. 4A to 4L are views illustrating a method of manufacturing a 3D semiconductor device according to an embodiment of the disclosure.

FIGS. 4A to 4L are views illustrating a method of manufacturing a 3D semiconductor device according to an embodiment of the disclosure. Referring to FIG. 4A, a method of manufacturing a 3D semiconductor device according to an embodiment may include forming a logic circuit layer 20 on a substrate 10. Forming the logic circuit layer may include forming a transistor 21, a logic interconnection 23, a logic insulating layer 25, and a common electrode layer 27 on the substrate 10. Forming the common electrode layer 27 may include forming one of a silicon layer doped with N-type ions, a metal layer such as, for example, tungsten (W), a metal compound layer such as, for example, titanium nitride (TiN), or a metal silicide on the logic insulating layer 25.

Figure 4B:
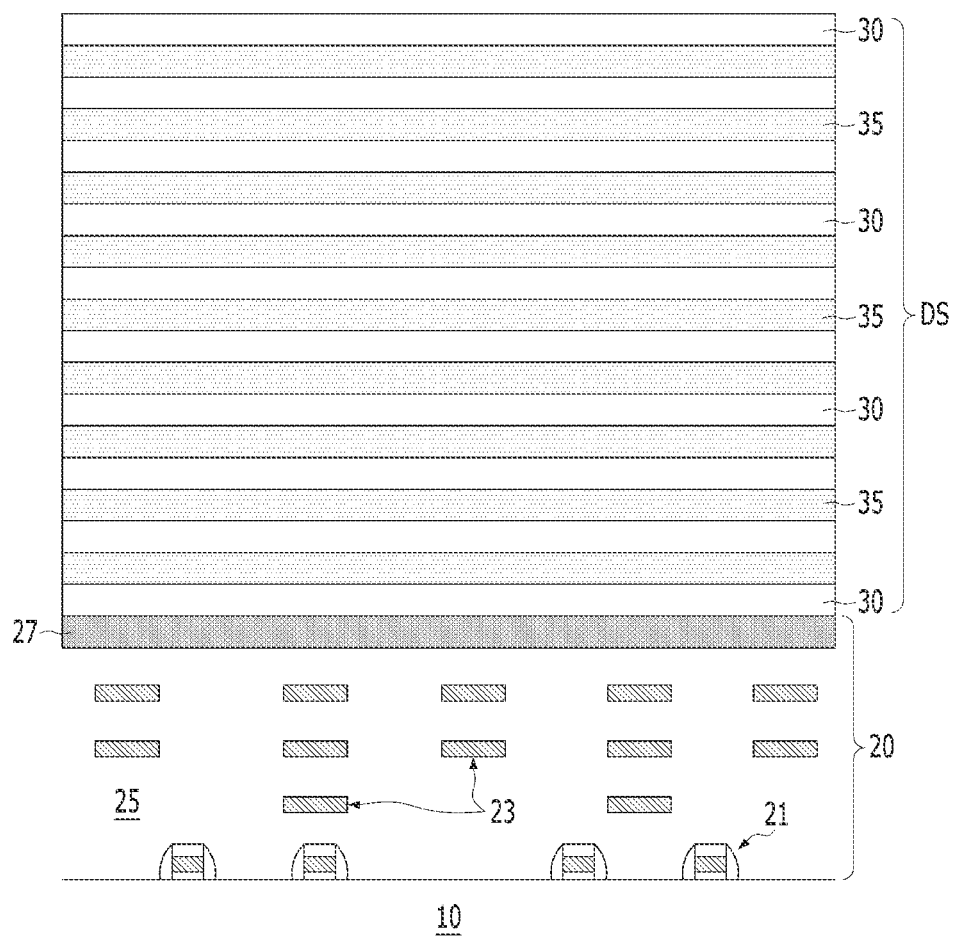
Figure 4C:
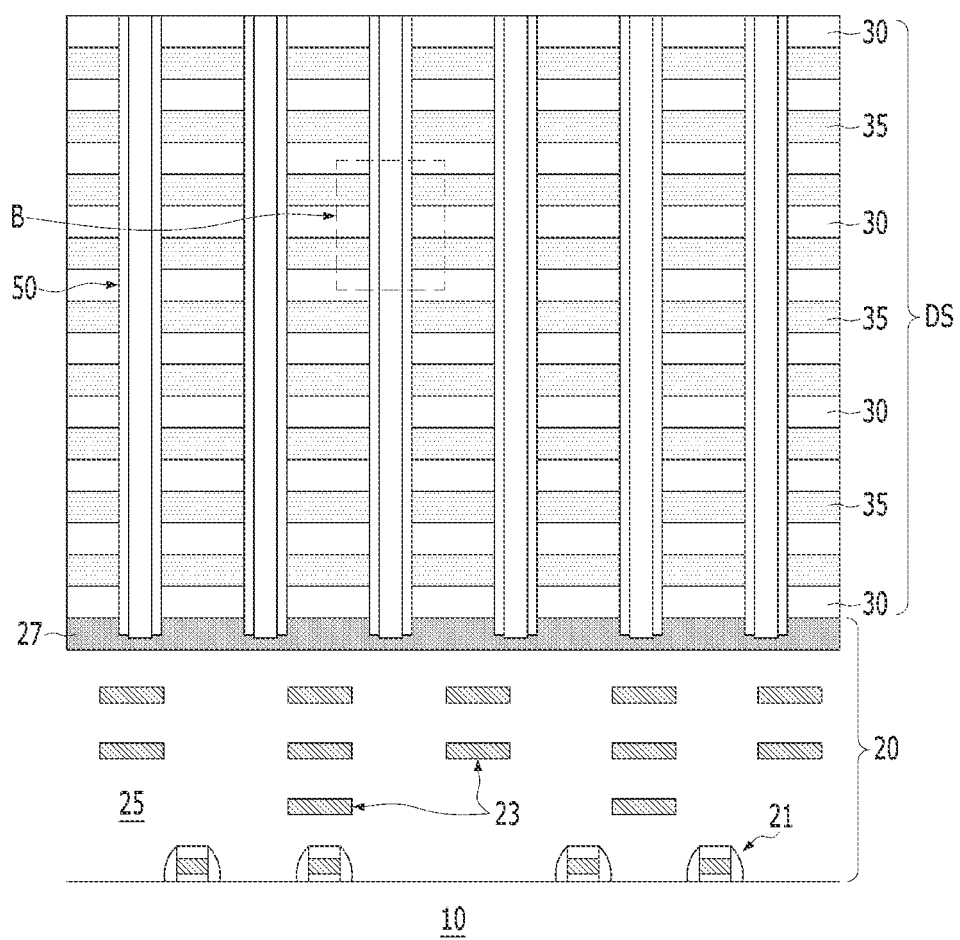

Referring to FIG. 4B, the method may further include forming an insulating layer stack DS on the logic circuit layer 20. Forming the insulating layer stack DS may include performing a plurality of deposition processes to alternately stack a plurality of interlayer insulating layers 30 and a plurality of sacrificial insulating layers 35 on the logic circuit layer 20. The direction of stacking of the plurality of interlayer insulating layers 30 may be also referred to as the vertical direction. The interlayer insulating layers 30 may include high-temperature silicon oxide ($SiO_2$), and the sacrificial insulating layers 35 may include silicon nitride (SiN). Referring to FIG. 4C, the method may further include forming a plurality of vertical channel pillars 50 vertically penetrating the insulating layer stack DS to be connected to the common electrode layer 27. Forming the vertical channel pillars 50 may include forming vertical channel holes that vertically penetrate the insulating layer stack DS to expose the common electrode layer 27, and forming various material layers in the vertical channel holes.

Figure 4D:
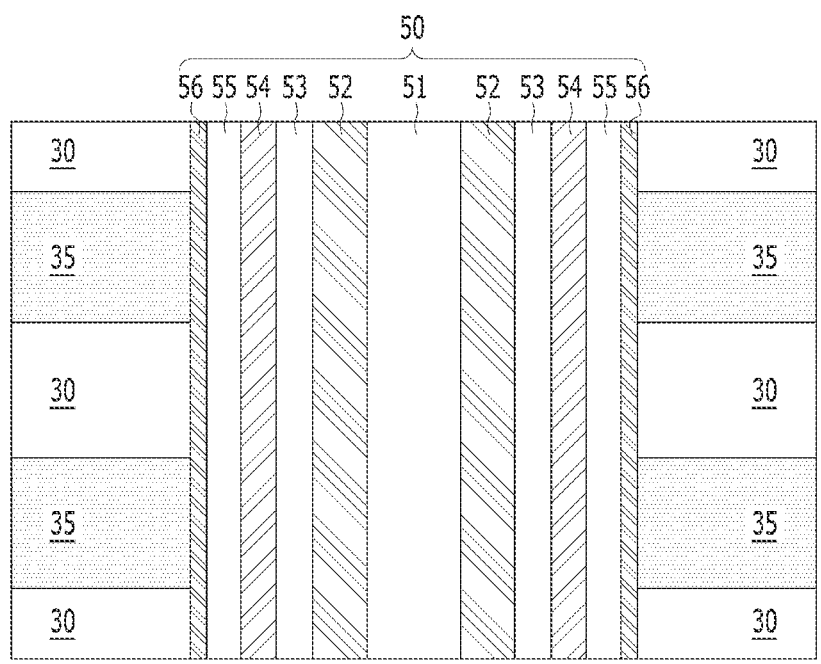

FIG. 4D is an enlarged view of area B of FIG. 4C. Referring to FIG. 4D, the vertical channel pillar 50 may include a core pillar 51 at the center, a channel layer 52 surrounding a sidewall of the core pillar 51, a tunneling layer 53 surrounding a sidewall of the channel layer 52, a charge trap layer 54 surrounding a sidewall of the tunneling layer 53, a barrier insulating layer 55 surrounding a sidewall of the charge trap layer 54, and a buffer layer 56 surrounding a sidewall of the barrier insulating layer 55. The channel layer 52, the tunneling layer 53, the charge trap layer 54, the barrier insulating layer 55, and the buffer layer 56 may have a cylindrical shape.

Forming the vertical channel pillar 50 may include performing a photolithography process and an etching process to form the vertical channel hole vertically penetrating the insulating layer stack DS, performing a first deposition process to conformably form the buffer layer 56 on an inner wall of the vertical channel hole, performing a second deposition process to conformably form the barrier insulating layer 55 on an inner wall of the buffer layer 56, performing a third deposition process to conformably form the charge trap layer 54 on an inner wall of the barrier insulating layer 55, performing a fourth deposition process to conformably form the tunneling layer 53 on an inner wall of the charge trap layer 54, forming a fifth deposition process to conformably form the channel layer 52 on an inner wall of the tunneling layer 53, and performing a gap-fill process to form the core pillar 51 filling the vertical channel hole on an inner wall of the channel layer 52.

Figure 4E:
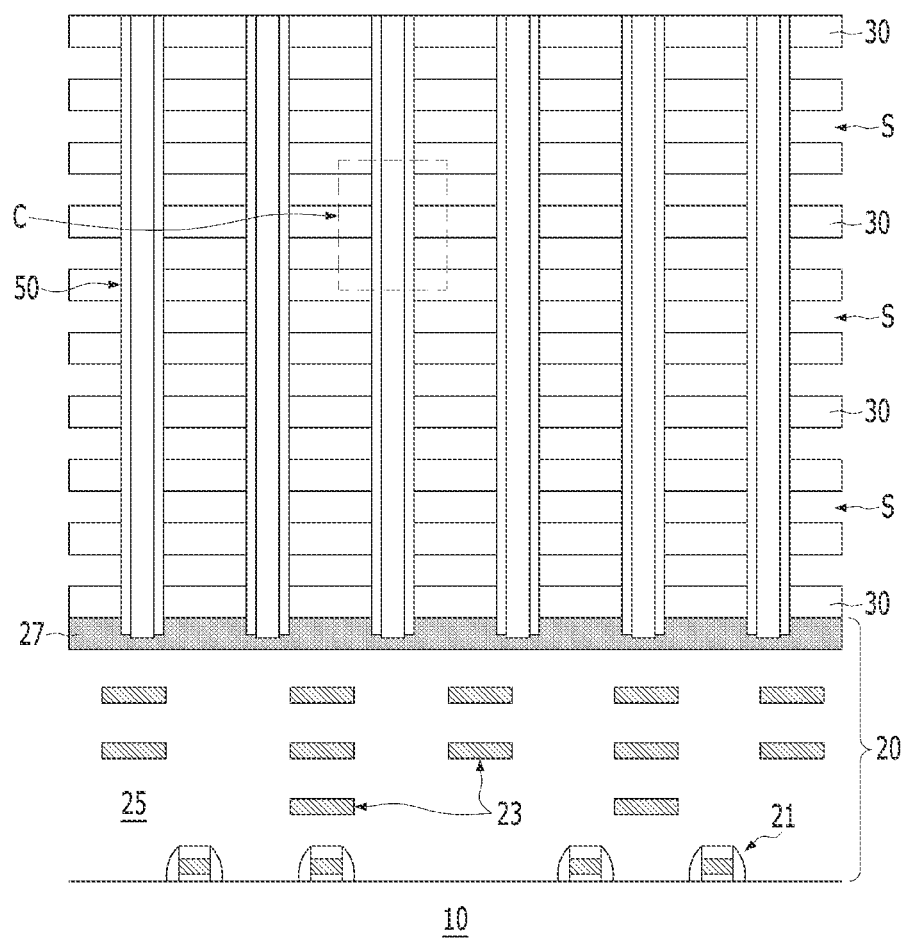
Figure 4F:
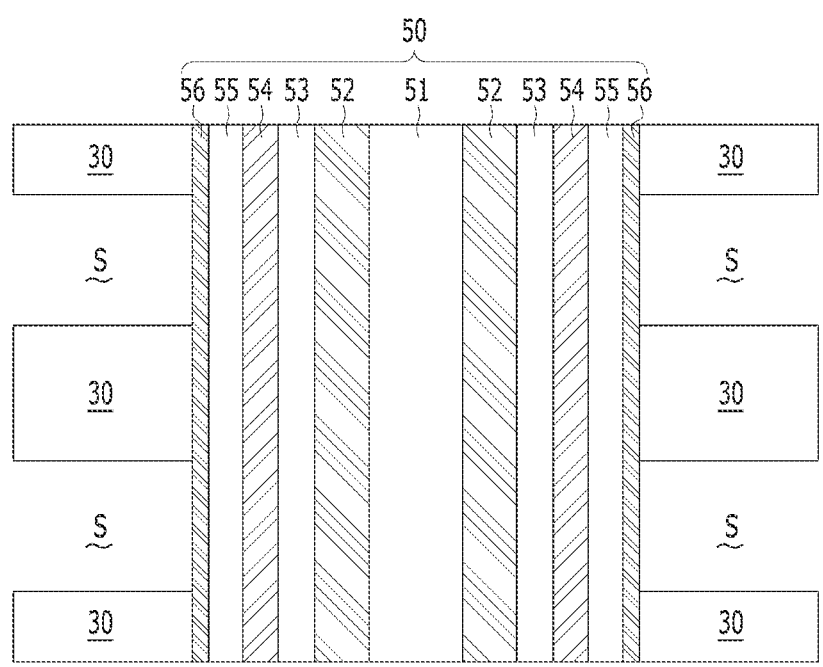

FIG. 4F is an enlarged view of area C of FIG. 4E. Referring to FIGS. 4E and 4F, the method may further include removing the sacrificial insulating layers 35 to form spaces S between the interlayer insulating layers 30 to expose side surfaces of the vertical channel pillars 50. Prior to this process, processes of forming slits for removing the sacrificial insulating layers 35 may be performed.

Figure 4G:
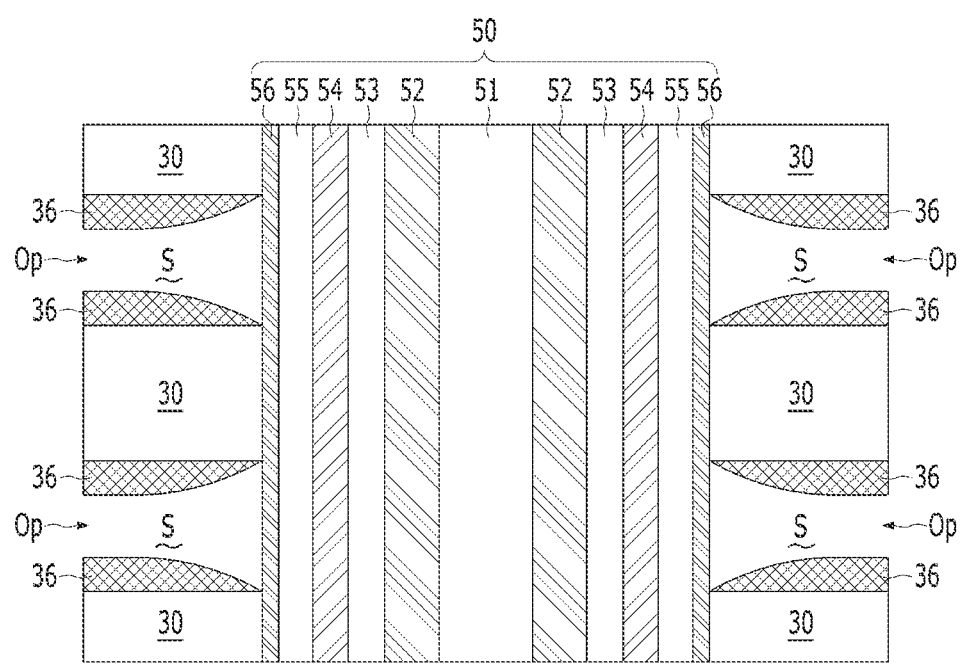

Referring to FIG. 4G, the method may further include forming masking layers 36 through the slits on surfaces of interlayer insulating layers 30. The thickness of the masking layers 36 may become gradually thinner as it gets closer to the vertical channel pillars 50. For example, the masking layers 36 may have an over-hang shape. The masking layers 36 may have an etching selectivity to the buffer layer 56 and the interlayer insulating layer 30. In one embodiment, the masking layer 36 may include at least one of spin-on-glass (SOG), low-temperature silicon oxide (LTO), carbon-doped silicon oxide (SiOC), silicon oxynitride (SiON), or polysilicon. The masking layers 36 may form openings Op that spatially connect the spaces S and the outside.

Figure 4H:
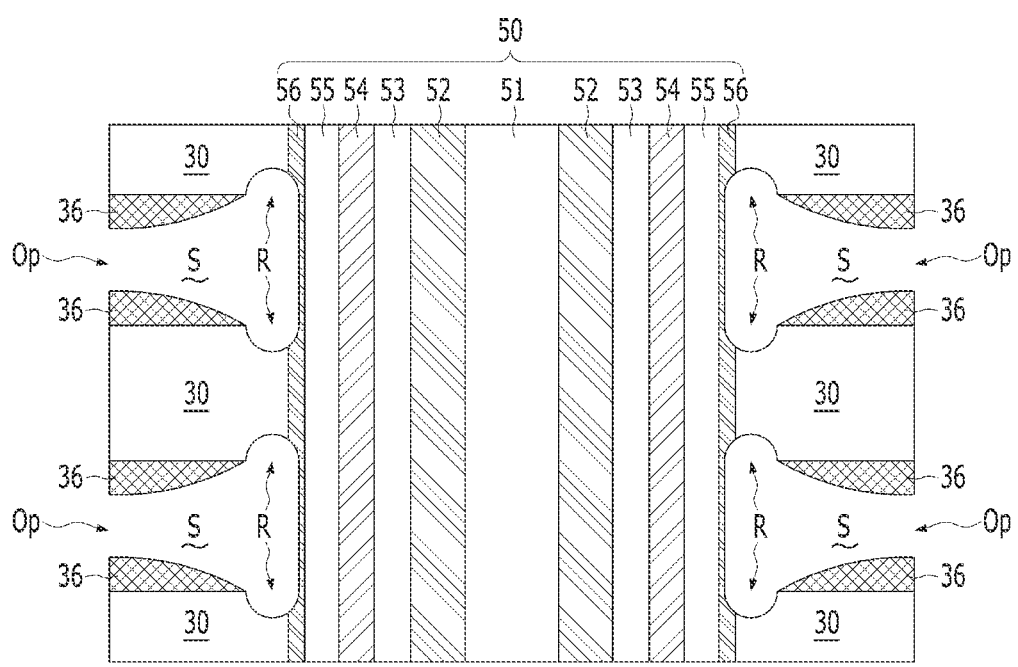

Referring to FIG. 4H, the method may further include partially removing the buffer layer 56 and the interlayer insulating layer 30 exposed in the spaces S through the openings Op to form recesses R. In an embodiment, the masking layers 36 may be removed in this process.

Figure 4I:
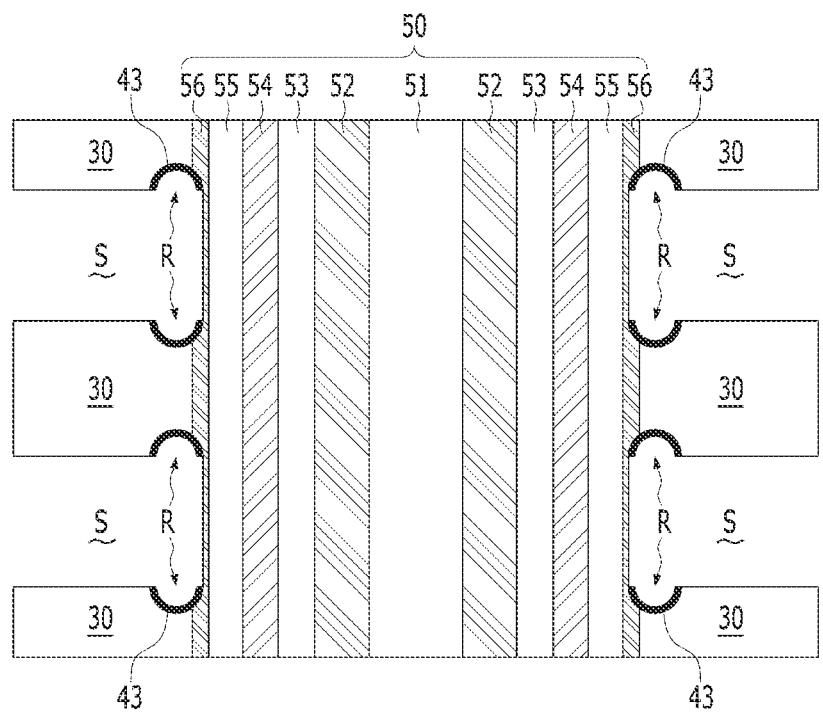

Referring to FIG. 4I, the method may further include conformably forming a lining layer 43 in the recesses R. Forming the lining layer 43 may include conformably forming a high-k dielectric film such as, for example, strontium titanate ($SrTiO_3$), zirconium oxide ($ZrO_2$), or hafnium oxide ($HfO_2$), and performing an etching process to allow that the high-k dielectric film remains in the recesses R. In an embodiment, the masking layer 36 may be removed in this process.

Figure 4J:
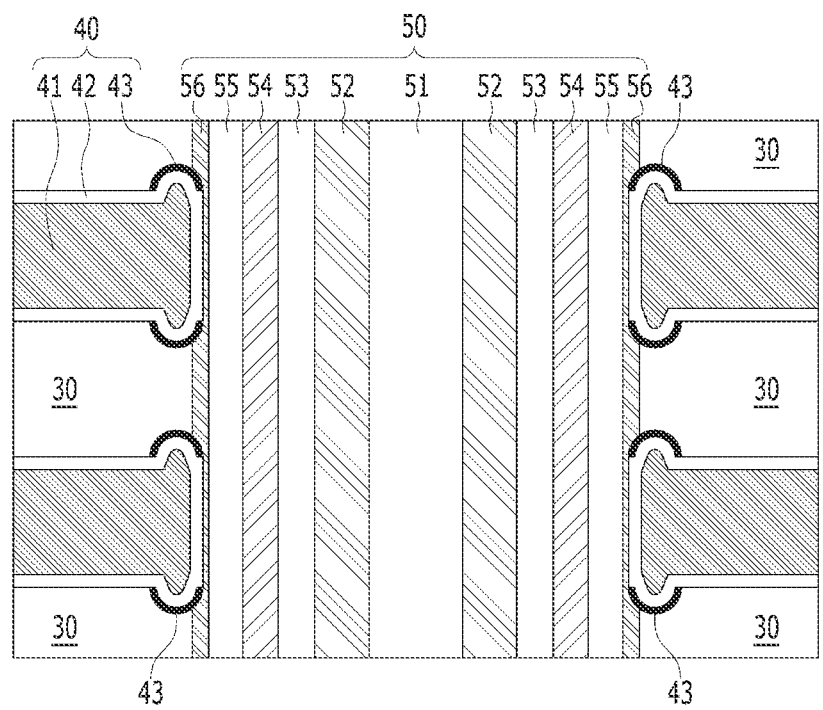

Referring to FIG. 4J, the method may further include conformably forming a barrier metal layer 42 and filling the word line electrodes 41 in the spaces S and the recesses R to form a word line structure 40. The barrier metal layer 42 may include a barrier metal such as, for example, titanium nitride (TiN) or tantalum nitride (TaN). The word line electrode 41 may include a metal such as, for example, tungsten (W).

Figure 4K:
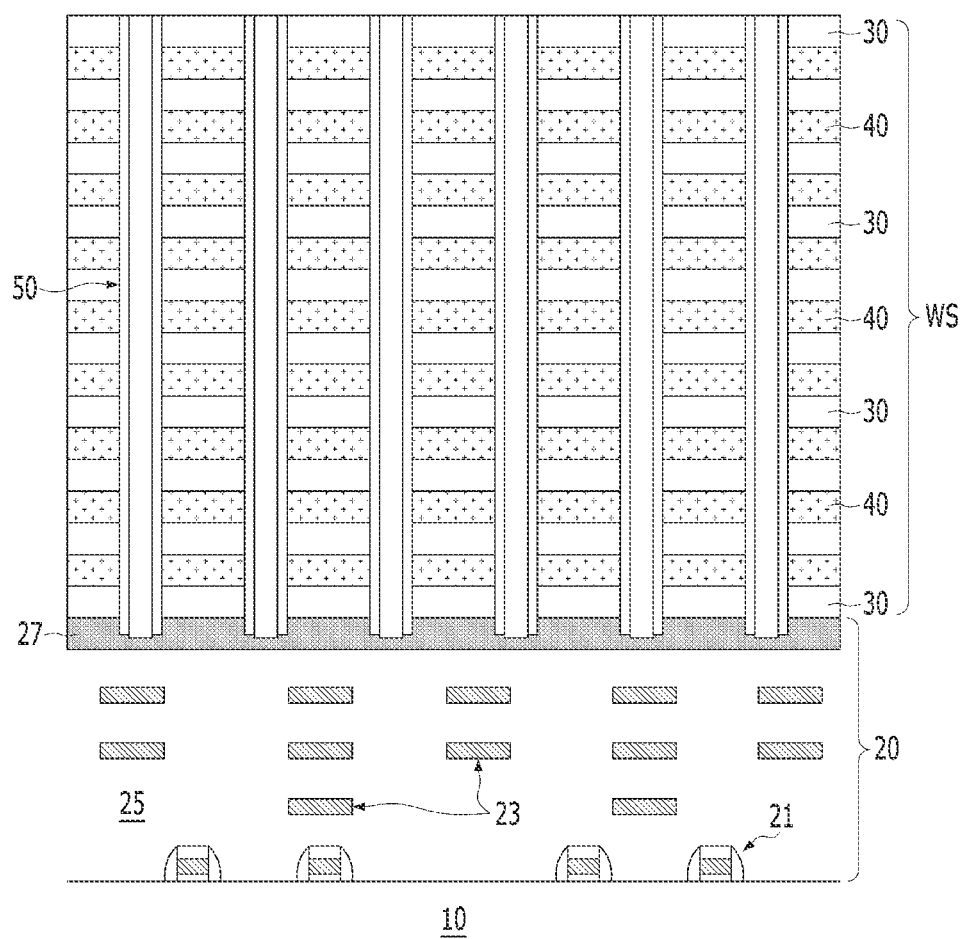

FIG. 4K shows that the word line stack WS is formed by performing the word line replacement process described with reference to FIGS. 4G to 4J. In comparison with FIG. 4C, the sacrificial insulating layers 35 may be replaced with the word line structures 40 so that the word line stack WS may be formed. Accordingly, the word line stack WS may include interlayer insulating layers 30 and word line structures 40 alternately stacked.

Figure 4L:
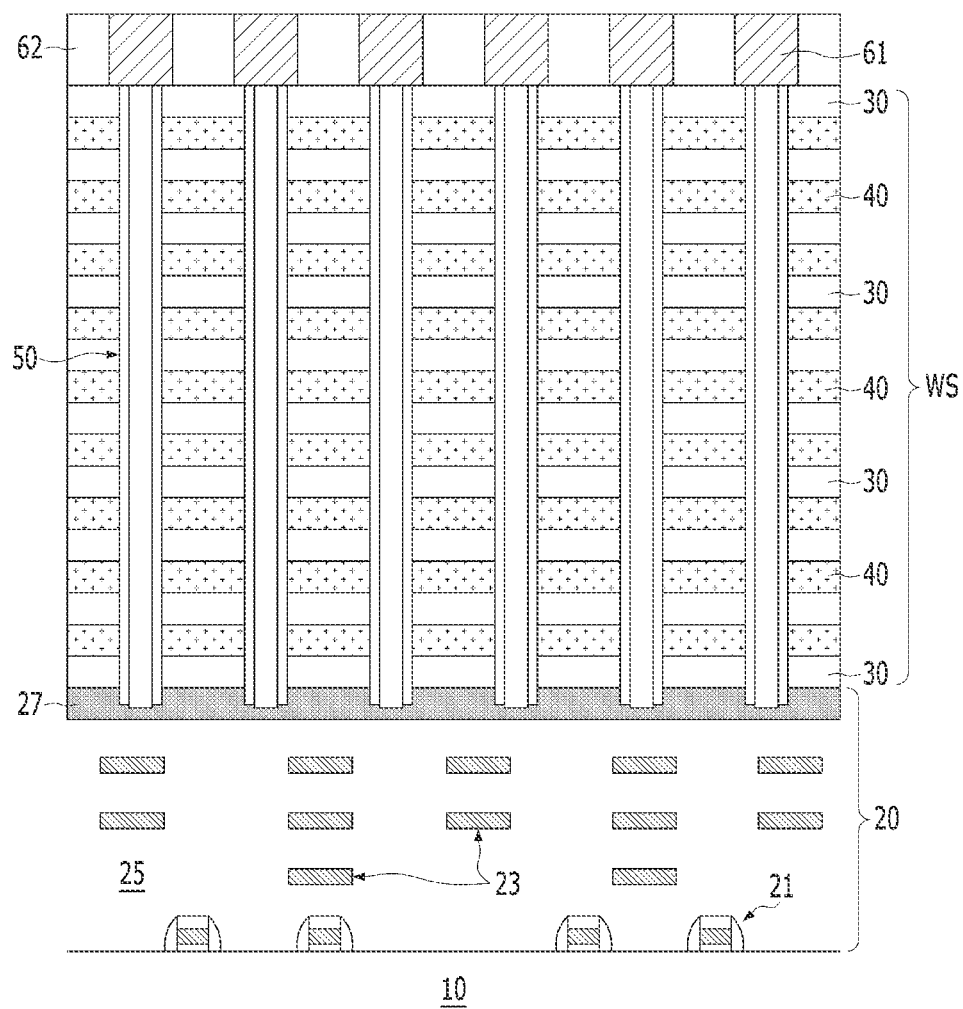

Referring to FIG. 4L, the method may further include forming contact plugs 61 vertically aligned with vertical channel pillars 50 on the word line stack WS, and forming a lower interconnection insulating layer 62 surrounding side surfaces of the contact plugs 61. Top surfaces of the contact plugs 61 and top surfaces of the lower interconnection insulating layers 62 may be coplanar. Thereafter, referring to FIG. 1, the method may further include forming bit lines 63 on the contact plugs 61, and forming an upper interconnection insulating layer 64 surrounding side surfaces of the bit lines 63. Top surfaces of the bit lines 63 and top surfaces of the upper interconnection insulating layers 64 may be coplanar. The contact plugs 61 and the bit lines 63 may include metal, and the lower interconnection insulating layer 62 and the upper interconnection insulating layer 64 may include an insulating material such as, for example, silicon oxide.

Figure 5:
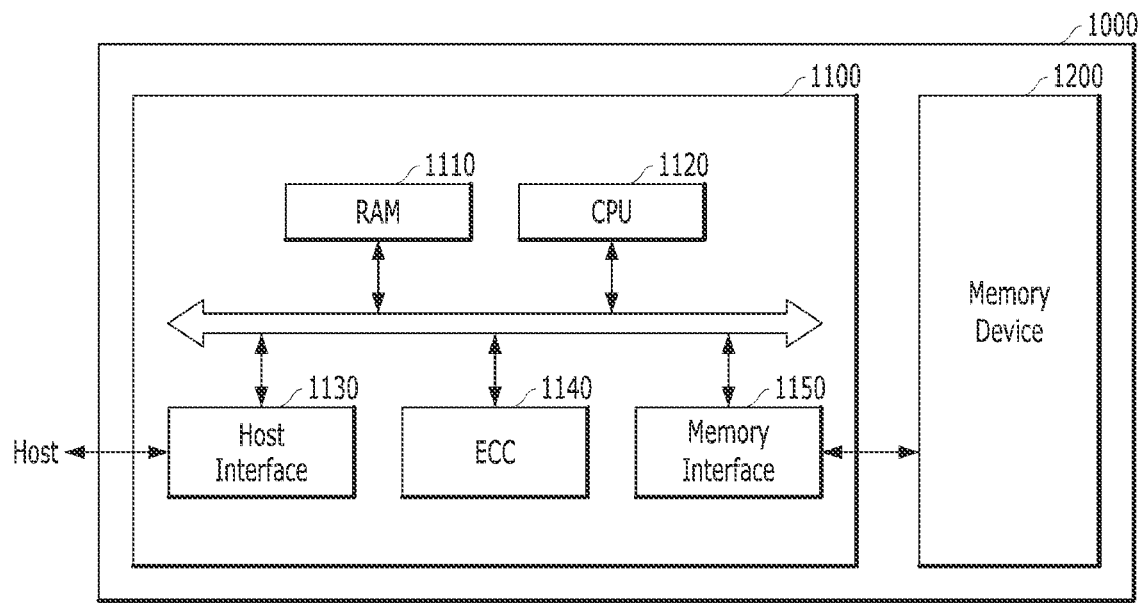
FIGS. 5 and 6 are block diagrams illustrating a configuration of memory systems in accordance with embodiments of the present disclosure.

FIG. 5 is a block diagram illustrating a configuration of a memory system according to an embodiment of the present disclosure. Referring FIG. 5, a memory system 1000 may include a memory device 1200 and a controller 1100. The memory device 1200 may be used to store data information having a variety of data forms such as, for example, text, graphics, and software codes. The memory device 1200 may be a nonvolatile memory. Furthermore, the memory device 1200 may include at least one of the 3D memory devices according to the embodiments of the present disclosure. The controller 1100 may be coupled to a host Host and the memory device 1200. The controller 1100 may access the memory device 1200 in response to a request from the host Host. For example, the controller 1100 may control read, write, erase, and background operations of the memory device 1200. The controller 1100 may include at least one of a random-access memory (RAM) 1110, a central processing unit (CPU) 1120, a host interface 1130, an error correction code (ECC) circuit 1140, and a memory interface 1150. The RAM 1110 may be used as an operation memory of the CPU 1120, a cache memory between the memory device 1200 and the host Host, a buffer memory between the memory device 1200 and the host Host, and so forth. For reference, the RAM 1110 may be replaced with other types of memory, for example a static random access memory (SRAM), a read only memory (ROM), or the like. The CPU 1120 may control the overall operations of the controller 1100. For example, the CPU 1120 may execute instructions, e.g., firmware such as, for example, a flash translation layer (FTL) stored in the RAM 1110. The host interface 1130 may interface with the host Host. For example, the controller 1100 may communicate with the host Host through at least one of various communication standards or interface protocols such as, for example, a universal serial bus (USB) protocol, a multimedia card (MMC) protocol, a peripheral component interconnection (PCI) protocol, a PCI-express (PCI-E) protocol, an advanced technology attachment (ATA) protocol a serial-ATA protocol, a parallel-ATA protocol, a small computer small interface (SCSI) protocol, an enhanced small disk interface (ESDI) protocol, and an integrated drive electronics (IDE) protocol, a private protocol, and the like. The ECC circuit 1140 may use an error correction code (ECC) to detect and correct errors in data read from the memory device 1200. The memory interface 1150 may interface with the memory device 1200. For example, the memory interface 1150 may include a NAND interface or a NOR interface. For example, the controller 1100 may further include a buffer memory for temporarily storing data. The buffer memory may be used to temporarily store data to be transferred from the host interface 1130 to an external device or data to be transferred from the memory interface 1150 to the memory device 1200. In addition, the controller 1100 may further include a ROM that stores code data for interfacing with the host Host. Since the memory system 1000 according to the present embodiment may include the memory device 1200 having improved integration and characteristics resulting from embodiments of the disclosure, the integration, and characteristics of the memory system 1000 may also be improved.

Figure 6:
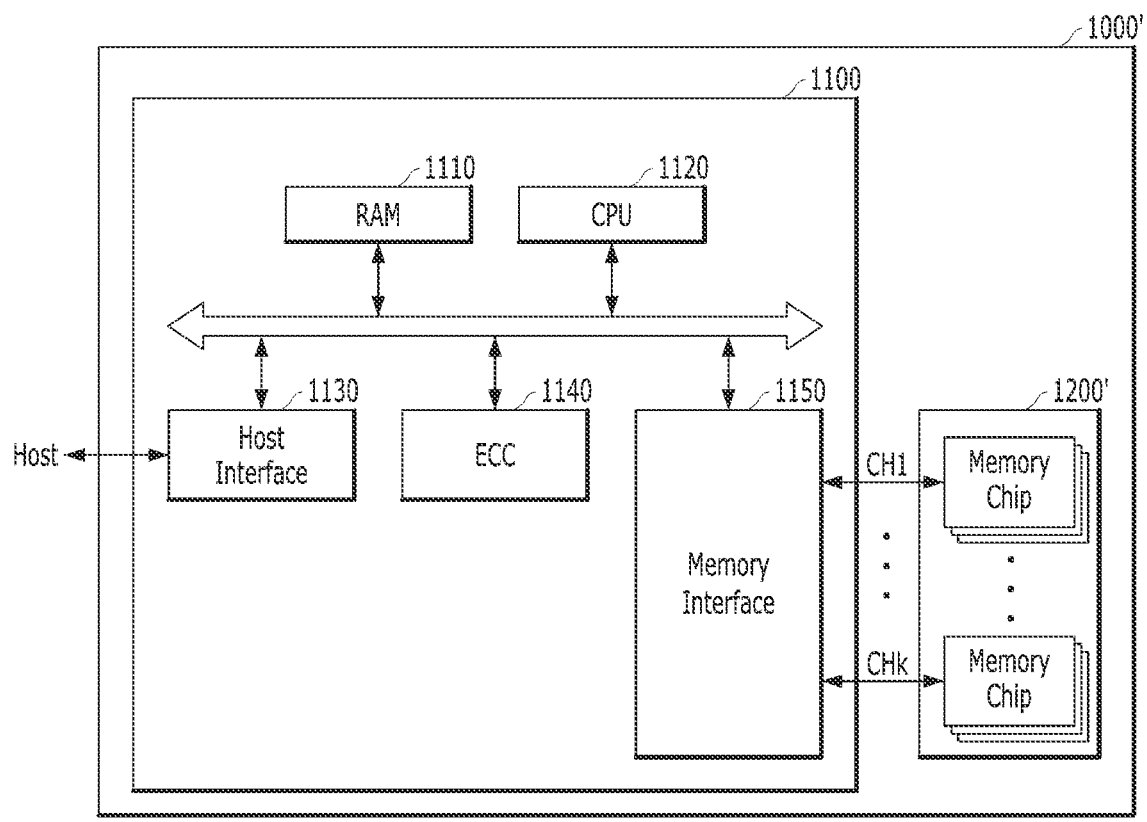

FIG. 6 is a block diagram illustrating a configuration of a memory system according to an embodiment of the present disclosure. Hereinafter, repetitive explanation will be omitted if deemed redundant. Referring to FIG. 6, a memory system 1000' according to an embodiment may include a memory device 1200' and a controller 1100. Furthermore, the controller 1100 may include a RAM 1110, a CPU 1120, a host interface 1130, an ECC circuit 1140, a memory interface 1150 and so on. The memory device 1200' may include a nonvolatile memory. Furthermore, the memory device 1200' may have at least one of the 3D memory devices according to the embodiments of the present disclosure. In addition, the memory device 1200' may include a multi-chip package having a plurality of memory chips.

The plurality of memory devices may be divided into a plurality of groups. The plurality of groups may communicate with the controller 1100 through first to k-th channels CH1 to CHk (where k is an integer). The memory chips of each group may communicate with the controller 1100 through a common channel. For reference, the memory system 1000' may be modified such that each single memory chip is coupled to a corresponding single channel. As described above, since the memory system 1000' according to the embodiment may include the memory device 1200' having improved integration and characteristics resulting from embodiments of the disclosure, the integration, and characteristics of the memory system 1000' may also be improved. In particular, the memory device 1200' may include the multi-chip package, whereby the data storage capacity and the operating speed thereof can be enhanced.

Figure 7:
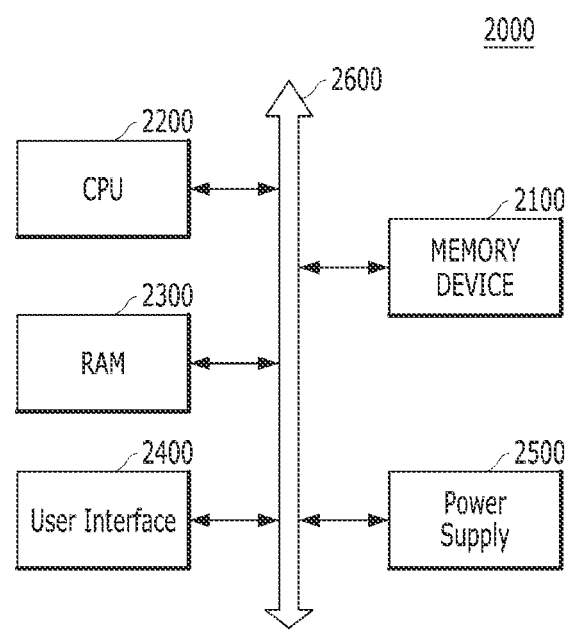
FIGS. 7 and 8 are block diagrams illustrating a configuration of computing systems according to embodiments of the present disclosure.

FIG. 7 is a block diagram illustrating a configuration of a computing system according to an embodiment of the present disclosure. Hereinafter, repetitive explanation will be omitted if deemed redundant. Referring to FIG. 7, a computing system 2000 according to an embodiment of the present disclosure may include a memory device 2100, a CPU 2200, a RAM 2300, a user interface 2400, a power supply 2500, a system bus 2600, and so forth. The memory device 2100 stores data provided via the user interface 2400, data processed by the CPU 2200, etc. Furthermore, the memory device 2100 may be electrically coupled to the CPU 2200, the RAM 2300, the user interface 2400, the power supply 2500, and etc. by the system bus 2600. For example, the memory device 2100 may be connected to the system bus 2600 through a controller or directly connected to the system bus 2600. In the case where the memory device 2100 is directly connected to the system bus 2600, the function of the controller may be performed by the CPU 2200, the RAM 2300, etc. The memory device 2100 may include a nonvolatile memory. The memory device 2100 may include at least one of the 3D memory devices according to the embodiments of the present disclosure. Furthermore, the memory device 2100 may include a multi-chip package including a plurality of memory chips as described in reference to FIG. 6. The computing system 2000 may include one of a computer, an ultra-mobile PC (UMPC), a workstation, a netbook, a personal digital assistance (PDA), a portable computer, a web tablet, a wireless phone, a mobile phone, a smart phone, an e-book, a portable multimedia player (PMP), a portable gaming device, a navigation device, a black box, a digital camera, a 3D television, a digital audio recorder, a digital audio player, a digital picture recorder, a digital picture player, a digital video recorder, a digital video player, a device in capable to transmit and receive information in a wireless environment, one of various electronic devices composing a home network, a computer network, or a telematics network, or an RFID deice. As described above, since the computing system 2000 according to the embodiment includes the memory device 2100 having improved integration and characteristics resulting from embodiments of the disclosure, the characteristics of the computing system 2000 may also be improved.

Figure 8:
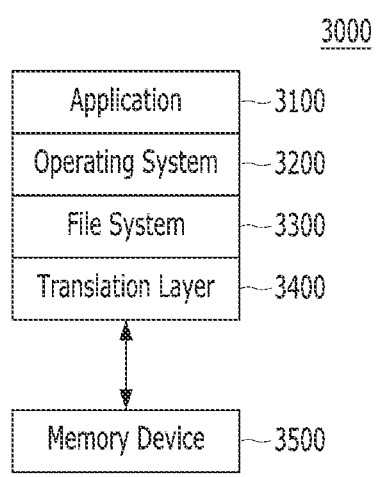

FIG. 8 is a block diagram illustrating a computing system according to an embodiment of the present disclosure. Referring to FIG. 8 a computing system 3000 according to an embodiment of the present disclosure may include a software layer, which includes, for example, an operating system 3200, an application 3100, a file system 3300, a translation layer 3400, and so forth. Furthermore, the computing system 3000 may include a hardware layer such as, for example, a memory device 3500. The operating system 3200 may manage software resources and hardware resources, etc. of the computing system 3000 and may control program execution by the CPU. The application 3100 may be various application programs executed in the computing system 3000 and may be a utility executed by the operating system 3200. The file system 3300 may refer to a logical structure for controlling data, files, etc. which are present in the computing system 3000 and may organize files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like. Although the operating system 3200, the application 3100, and the file system 3300 are expressed by separate blocks in the drawing, the application 3100 and the file system 3300 may be included in the operating system 3200. The translation layer 3400 may translate an address into a suitable form for the memory device 3500 in response to a request from the file system 3300. For example, the translation layer 3400 may translate a logical address produced by the file system 3300 into a physical address of the memory device 3500. Mapping information of the logical address and the physical address may be stored in an address translation table. For example, the translation layer 3400 may be a flash translation layer (FTL), a universal flash storage link layer (ULL), or the like. The memory device 3500 may be a nonvolatile memory. Furthermore, the memory device 3500 may include at least one of the 3D memory devices according to the embodiments of the present disclosure. As described above, since the computing system 3000 according to the present embodiment may include the memory device 3500 having improved integration and characteristics resulting from embodiments of the disclosure, the characteristics of the computing system 3000 may also be improved.

According to the embodiments of the present disclosure, since the electric field between the word line structure and the channel layer is widened, charge trapping capability of a charge trap layer may be improved.

While this disclosure contains many specifics, these should not be construed as limitations on the scope of the present disclosure or of what may be claimed, but rather as descriptions of features that may be specific to particular embodiments of the present disclosure. Certain features that are described in this disclosure in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this disclosure should not be understood as requiring such separation in all embodiments. Only a few embodiments and examples are described. Other embodiments, enhancements, and variations can be made based on what is described and illustrated in this disclosure.

What is claimed is:

1. A three-dimensional semiconductor device, the three-dimensional semiconductor device comprising: a substrate; a common electrode layer on the substrate; a word line stack disposed on the common electrode layer, the word line stack having interlayer insulating layers and word line structures alternately stacked; and a vertical channel pillar penetrating the word line stack, the vertical channel pillar being electrically connected to the common electrode layer, wherein: each of the word line structures includes a body portion having a first vertical width and an extension portion having a second vertical width greater than the first vertical width, and the extension portion abuts the vertical channel pillar wherein the extension portion includes a word line core, a barrier metal layer surrounding a top surface and a bottom surface of the word line core, and a lining layer partially surrounding the barrier metal layer to be in contact with the vertical channel pillar.

2. The three-dimensional semiconductor device of claim 1,
wherein the extension portion includes an upper protruding portion upwardly protruding from a top surface of the body portion and a lower protruding portion downwardly protruding from a bottom surface of the body portion.

3. The three-dimensional semiconductor device of claim 2, wherein:
the body portion includes the word line core and the barrier metal layer, the barrier metal layer surrounding the top surface and the bottom surface of the word line core to be in contact with a corresponding one of the interlayer insulating layers.

4. The three-dimensional semiconductor device of claim 2,
wherein the vertical channel pillar includes:
a core pillar;
a channel layer surrounding a side surface of the core pillar;
a tunneling layer surrounding a side surface of the channel layer;
a charge trap layer surrounding a side surface of the tunneling layer;
a barrier insulating layer surrounding a side surface of the charge trap layer; and
a buffer layer surrounding a side surface of the barrier insulating layer,
wherein the extension portion laterally protrudes inside the vertical channel pillar.

5. The three-dimensional semiconductor device of claim 4,
wherein an interface between the extension portion and the vertical channel pillar is positioned inside the buffer layer.

6. The three-dimensional semiconductor device of claim 4,
wherein an interface between the extension portion and the vertical channel pillar abuts the barrier insulating layer.

7. The three-dimensional semiconductor device of claim 4,
wherein an interface between the extension portion and the vertical channel pillar is positioned inside the barrier insulating layer.

8. The three-dimensional semiconductor device of claim 4,
wherein:
the barrier insulating layer includes metal oxide, and
the buffer layer includes silicon oxide.

9. The three-dimensional semiconductor device of claim 1,
wherein the lining layer is formed at the upper protruding portion and the lower protruding portion, and the lining layer is not formed at an interface between the barrier metal layer and the vertical channel pillar.

10. The three-dimensional semiconductor device of claim 1,
wherein the lining layer includes an insulating material having a high dielectric constant greater than 10.

11. The three-dimensional semiconductor device of claim 1,
wherein:
the word line core includes a metal, and
the barrier metal layer includes at least one of titanium nitride and tantalum nitride.

12. The three-dimensional semiconductor device of claim 1, further comprising:
a transistor, a logic interconnection, and a logic insulating layer surrounding the transistor and the logic interconnection formed between the substrate and the common electrode layer, and
wherein the common electrode layer is formed on the logic insulating layer.

13. A three-dimensional semiconductor device, the three-dimensional semiconductor device comprising: a substrate; a common electrode layer on the substrate; a word line stack disposed on the common electrode layer, the word line stack including interlayer insulating layers and word line structures alternately stacked; and a vertical channel pillar penetrating the word line stack and electrically connected to the common electrode layer, wherein each of the word line structures includes a body portion between the interlayer insulating layers and an extension portion in contact with the vertical channel pillar, wherein the extension layer includes an upper protruding portion upwardly protruding from a top surface of the body portion and a lower protruding portion downwardly protruding from a bottom surface of the body portion, wherein the extension portion includes a word line core, a barrier metal layer surrounding a top surface and a bottom surface of the word line core, and a lining layer partially surrounding the barrier metal layer and being in contact with the vertical channel pillar.

14. The three-dimensional semiconductor device of claim 13,
wherein:
the body portion include the word line core and the barrier metal layer surrounding the top surface and the bottom surface of the word line core and being in contact with a corresponding one of the interlayer insulating layers.

15. The three-dimensional semiconductor device of claim 13,
wherein:
the lining layer is formed at the upper protruding portion and the lower protruding portion of the extension portion, and
the lining layer is not formed at an interface between the extension portion and the vertical channel pillar.

16. The three-dimensional semiconductor device of claim 13,
wherein the vertical channel pillar includes:
a core pillar;

a channel layer surrounding a side surface of the core pillar;

a tunneling layer surrounding a side surface of the channel layer;

a charge trap layer surrounding a side surface of the tunneling layer;

a barrier insulating layer surrounding a side surface of the charge trap layer; and a buffer layer surrounding the barrier insulating layer, wherein the extension portion laterally protrudes inside the vertical channel pillar.

17. The three-dimensional semiconductor device of claim 16, wherein an interface between the extension portion and the vertical channel pillar is closer to the core pillar than an interface between the interlayer insulating layer and the vertical channel pillar.

18. The three-dimensional semiconductor device of claim 16, wherein the extension portion is formed inside the buffer layer.

19. The three-dimensional semiconductor device of claim 13, wherein:

each of the word line structures includes a word line core and a barrier metal layer surrounding the word line core, the word line core has a first vertical width at the body portion, the word line core has a second vertical width at the extension portion, and the second vertical width is greater than the first vertical width.

20. A semiconductor device, the device comprising:

a word line stack disposed over a common electrode layer, the word line stack including alternating interlayer insulating layers and word line structures;

wherein each of the word line structures includes a body portion and an extension portion at one end of the body portion, the extension portion being in contact with a vertical pillar channel, and wherein the extension portion includes an upper protrusion portion extending vertically upwardly above a top surface of the body portion and a lower protruding portion extending vertically downwardly below a bottom surface of the body portion, wherein the extension portion includes a word line core, a barrier metal layer surrounding a top surface and a bottom surface of the word line core, and a lining layer partially surrounding the barrier metal layer.

* * * * *